US011899078B2

(12) United States Patent
Leroy et al.

(10) Patent No.: US 11,899,078 B2
(45) Date of Patent: Feb. 13, 2024

(54) METHOD FOR ESTIMATING THE AGEING STATE OF FUSE ELEMENTS AND AN ELECTRICAL FUSE MAINTENANCE SYSTEM

(71) Applicant: VOLVO TRUCK CORPORATION, Gothenburg (SE)

(72) Inventors: Frederic Leroy, Lyons (FR); David De Brito, Charvieu (FR)

(73) Assignee: VOLVO TRUCK CORPORATION, Gothenburg (SE)

(*) Notice: Subject to any disclaimer, the term of this patent is extended or adjusted under 35 U.S.C. 154(b) by 113 days.

(21) Appl. No.: 17/660,751

(22) Filed: Apr. 26, 2022

(65) Prior Publication Data

US 2022/0349959 A1 Nov. 3, 2022

(30) Foreign Application Priority Data

May 3, 2021 (EP) .................................... 21171869

(51) Int. Cl.
*G01R 31/00* (2006.01)
*G01R 31/74* (2020.01)
*H01H 85/30* (2006.01)

(52) U.S. Cl.
CPC ............ *G01R 31/74* (2020.01); *G01R 31/006* (2013.01); *H01H 85/30* (2013.01)

(58) Field of Classification Search
CPC ................................. G01R 31/00; G01R 31/74
USPC ......................................................... 324/550
See application file for complete search history.

(56) References Cited

U.S. PATENT DOCUMENTS

| 9,989,579 B2 | 6/2018 | Douglass et al. |
| 2010/0019913 A1 | 1/2010 | Rodseth et al. |
| 2010/0023286 A1 | 1/2010 | Rodseth et al. |
| 2016/0254661 A1 | 9/2016 | Matsumoto |
| 2016/0341777 A1 | 11/2016 | Liu et al. |
| 2018/0306852 A1* | 10/2018 | Douglass ............... G01R 31/74 |

FOREIGN PATENT DOCUMENTS

| CN | 110395114 A | 11/2019 |
| DE | 102012209138 A1 | 12/2013 |
| EP | 3422028 A1 | 1/2019 |
| JP | 2007043860 A | 2/2007 |
| KR | 20200133116 A | 11/2020 |
| WO | 2020193466 A1 | 10/2020 |

OTHER PUBLICATIONS

European Search Report dated Oct. 22, 2021 in corresponding European Patent Application No. 21171869.7, 11 pages.

* cited by examiner

*Primary Examiner* — Vincent Q Nguyen
(74) *Attorney, Agent, or Firm* — Venable LLP; Jeffri A. Kaminski

(57) ABSTRACT

An electrical fuse maintenance system includes sensor adapted to measure the current flowing through a fuse element, the voltage on the fuse element, the temperature of the fuse element, and/or the temperature of an environment surrounding the fuse element, a controller configured to monitor the current, the voltage, the temperatures over a period of time while the fuse element is connected to an energized electrical power unit. Based on the monitored current, voltage and temperatures, the controller is adapted to estimate a service life remaining of the fuse element.

19 Claims, 3 Drawing Sheets

METHOD FOR ESTIMATING THE AGEING STATE OF FUSE ELEMENTS AND AN ELECTRICAL FUSE MAINTENANCE SYSTEM

TECHNICAL FIELD

The invention relates to a method for estimating the ageing state of fuse elements provided inside a vehicle fuse box and an electrical fuse maintenance system that can be used in a electrical system of a motor vehicle Although the invention will be described in detail with respect to a truck, the invention is not restricted to this particular motorized vehicle, but may also be used in other motorized vehicles such as a bus, or a construction equipment or any vehicle provided with a motion system, such as an electric or thermic engine, or a hydrostatic drive.

BACKGROUND

It is known from prior art to protect electrical systems of a heavy-duty vehicle from excessively high operating currents within the battery system by installing electrical fuses. Electrical fuses are indispensable, since the requirements that are placed on current electrical systems with regard to their reliability, safety, performance and service life are constantly increasing. Typically, fuses are installed that burn out in the event of an overcurrent and are thus intended to prevent destruction of the electrical system due to possible short-circuits.

The fuses should have a long service life. However, the service life of a fuse can change over time as a result of different parameters, for example the temperature of the fuse, the current flowing through the fuse or the voltage across the fuse. For safety reasons, it is thus desirable to predict the available remaining service life of a fuse so as to warn the user of the motorized vehicle when the fuse must be replaced.

In the prior art, monitoring methods based on the recording of actual values of electrical and/or non-electrical variables that act on the fuse have been proposed. In particular, EP 3 422 028 discloses a vehicle comprising a diagnostic system for an electrical fuse that involves a determination of a resistance value based on sensed voltage and current values. The monitoring method disclosed in this document requires extremely precise voltage and current measurements, given that the internal resistance of a fuse is very low. Such a method is thus too complex to be carried out.

SUMMARY

An object of the invention is to provide a method for estimating the ageing state of fuse elements and an electrical fuse maintenance system predicting the end of life of monitored fuses and avoiding the above mentioned drawbacks of the prior art. The object is achieved by a method for estimating the ageing state of fuse elements provided inside a vehicle fuse box, this method comprising steps that consist to:

a) measure and monitor the current flowing through each fuse;
b) increment a counter each time the current flowing through the fuse exceeds fuse rating (e.g. 30 A), said counter corresponding to the number of current peaks supported by the fuse;
c) extract from a pre-established model a threshold number of current peaks that the fuse can withstand;
d) determining the ageing state of the fuse as the quotient between the counter calculated at step b) and the threshold number extracted at step c), the fuse being considered as worn out when said quotient reaches 100%.

The object is also achieved by an electrical fuse maintenance system comprising:
sensor means adapted to measure the current flowing through a fuse element, the voltage on the fuse element, the temperature of the fuse element and/or the temperature of the environment surrounding the fuse element,
a controller configured to monitor said current, said voltage, said temperatures over a period of time while the fuse element is connected to an energized electrical power unit,
wherein, based on the monitored current, voltage and temperatures, the controller is adapted to estimate a service life remaining of the fuse element.

Thus configured, the method and the system of the invention permit to predict the available remaining service life of a fuse without involving precise variable measurements or complex diagnostic methods.

Further advantages and advantageous features of the invention are disclosed in the following description and in the dependent claims.

BRIEF DESCRIPTION OF THE DRAWINGS

With reference to the appended drawings, below follows a more detailed description of embodiments of the invention cited as examples.

In the drawings.

DETAILED DESCRIPTION OF EXAMPLE EMBODIMENTS OF THE INVENTION

Figure 1:
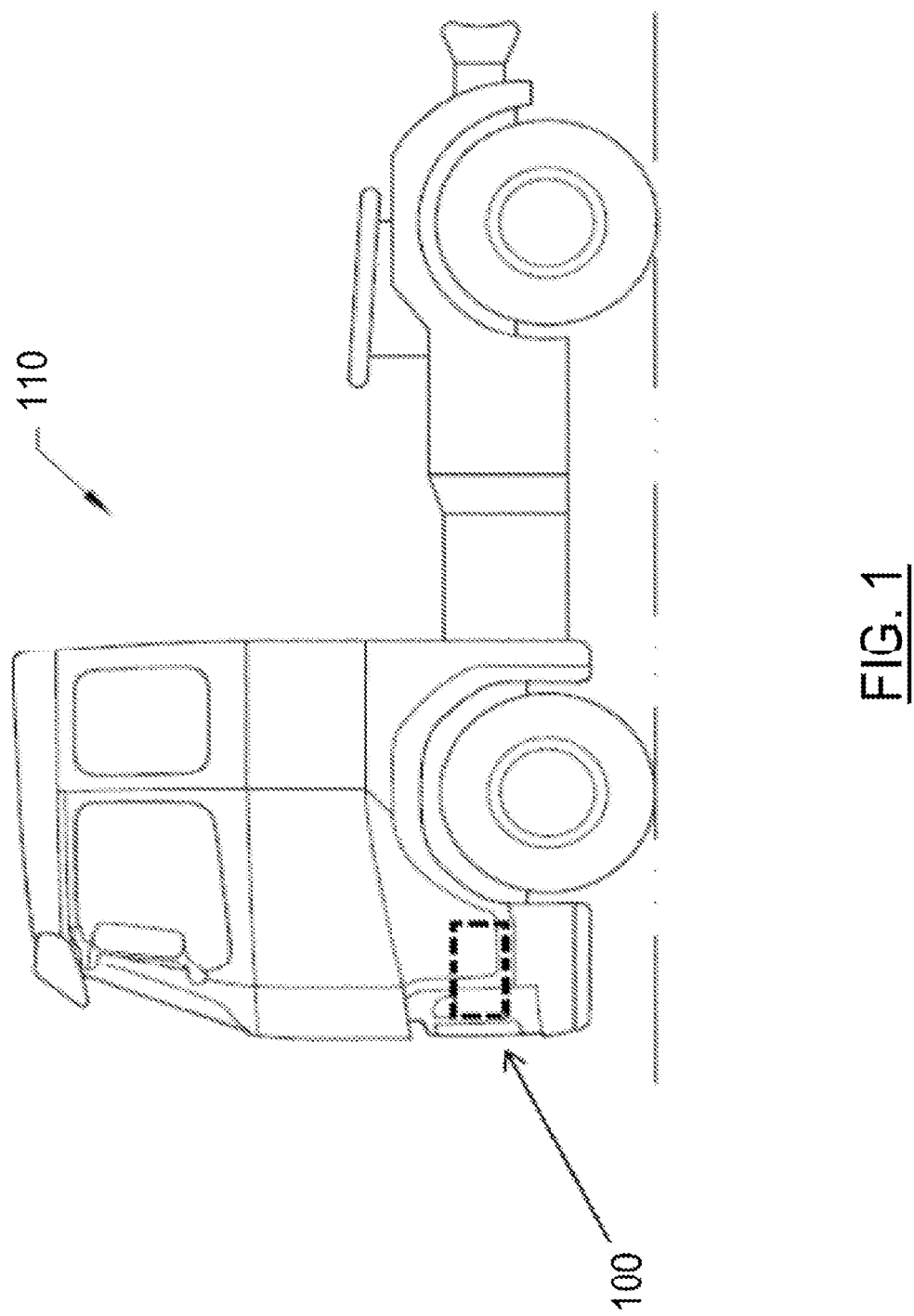
FIG. 1 shows a motorized vehicle, in particular a truck, comprising an electrical system according to the invention.
Figure 2:
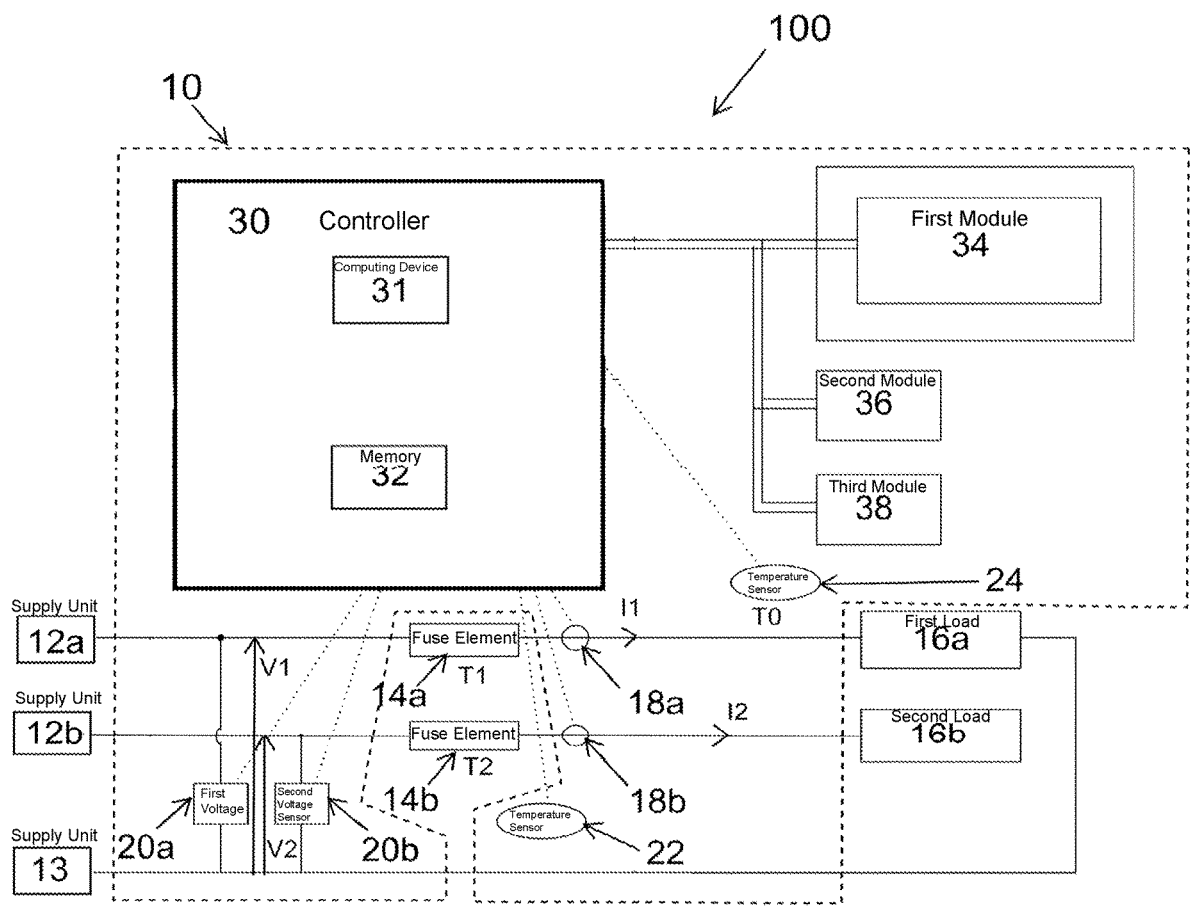
FIG. 2 is a schematic view of an electrical system according to the invention.

Referring to the Figures, wherein like reference numbers refer to the same or similar components throughout the several views, FIG. 1 shows a motorized vehicle 110, such as a truck, equipped with an electrical system 100. As illustrated in FIG. 2, the electrical system 100 includes a first voltage supply unit 12*a* configured to supply a 24 V voltage to a first electrical load 16*a* via a first fuse element 14*a*, and a second voltage supply unit 12*b* configured to supply a 12 V voltage to a second load 16*b* via a second fuse element 14*b*. It is to be understood that the invention is not limited to this specific embodiment. In particular, any number of voltage supply units, loads and/or fuse elements may be employed.

The first, respectively the second, fuse element 14*a*, respectively 14*b*, is configured so that, if the current I1, respectively I2, flowing through said first, respectively said second, fuse element exceed a predefined value, the first, respectively the second, fuse element 14*a*, respectively 14*b*, rises to a higher temperature and may directly melt, or indirectly melt another component, thereby opening the circuit. Any type of fuse element, employing any type of mechanism known to those of ordinary skill in the art, may be employed.

The electrical system 100 further comprises an electrical fuse maintenance system 10 according to the invention. The electrical fuse maintenance system 10 includes several sensors adapted to measure electrical and non-electrical variables that that act on the fuse elements 14a, 14b.

In particular, the current I1, respectively I2, may be measured via a first current sensor 18a, respectively via a second current sensor 18b.

The voltage V1, respectively the voltage V2, on the first fuse element 14a, respectively the second fuse element 14b, may be measured via a first voltage sensor 20a, via a second voltage sensor 20b, disposed between the line electrically connecting the first voltage supply unit 12a, respectively the second voltage supply unit 12b, to the first fuse element 14a, respectively to the second fuse element 14b, and the line connecting the first load 16a, respectively the second load 16b, to the ground 13.

The temperature T1 of the first fuse element 14a, respectively the temperature T2 of the second fuse element 14b, may be measured by a temperature sensor 22. Furthermore, the ambient temperature T0 may be measured by an ambient temperature sensor 24.

The electrical fuse maintenance system 10 further comprises a controller 30 that is operatively connected to said sensors 18a, 18b, 20a, 20b, 22 and 24 and to various other components of the vehicle 110. The controller is configured to monitor the currents I1, I2, the voltages V1, V2, and the temperatures T0, T1, T2 over a period of time and to estimate a service life remaining of the fuse elements 14a, 14b based on said monitored variables.

In particular, the controller 30 has a computing device 31 and a non-transitory memory 32 on which are recorded data and instructions for executing a method for estimating a remaining service life of the fuse elements 14a, 14b. The controller 30 may be an integral portion of, or a separate module operatively connected to, other control modules of the vehicle 110, such as the engine control module.

To estimate the remaining service life of the fuse elements 14a, 14b, the controller 30 may determine specific features that may have a direct impact on the service life of the fuse elements 14a, 14b.

Figure 3:
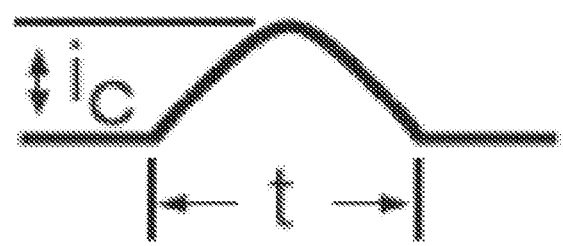
FIG. 3 illustrates an example of a pulse current that can be generated during the operating of the fuse element illustrated in FIG. 1.
Figure 4:
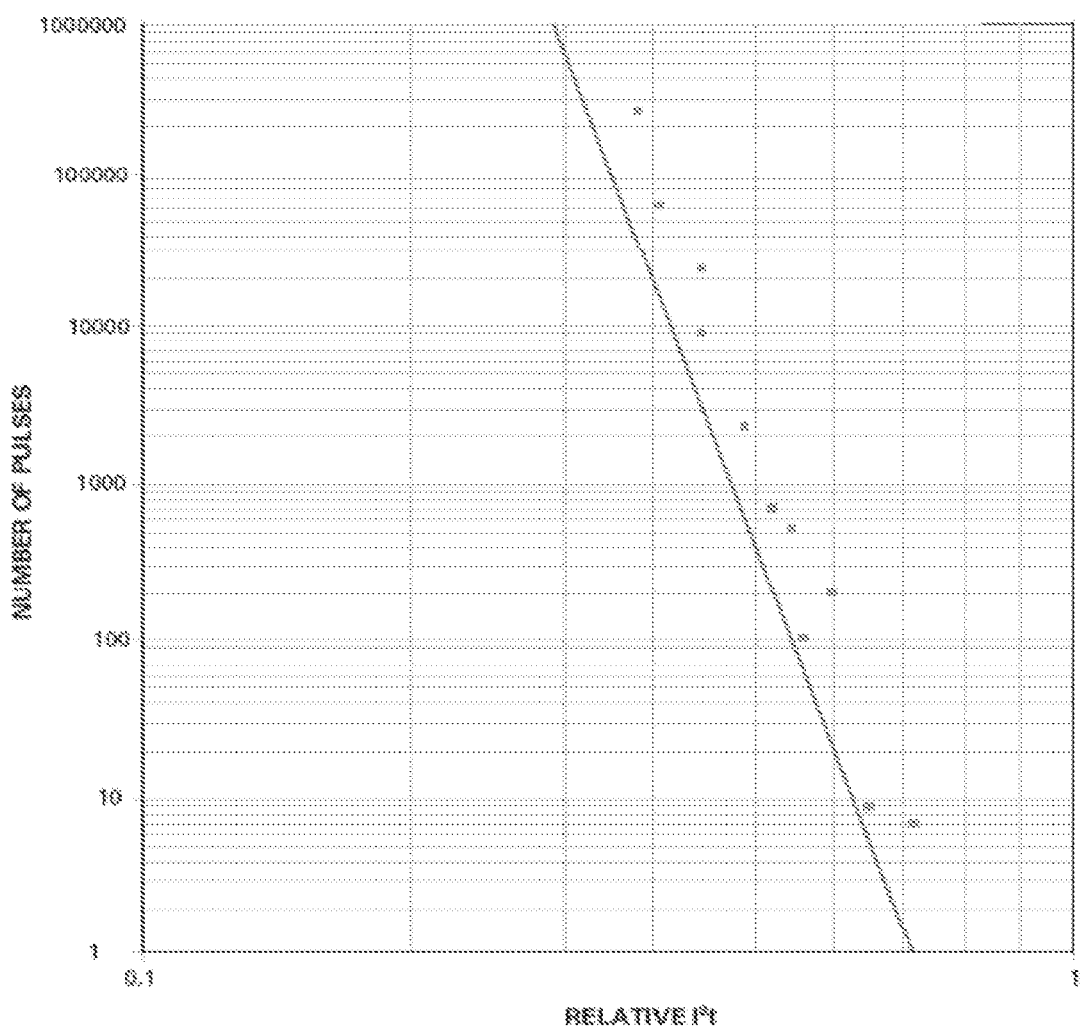
FIG. 4 is a graph of the pulse cycle withstand capability of a blade fuse element.

In particular, it is known that fuse elements are generally submitted to transient surge or pulse currents characterized by current peaks and wave shaped form across a current versus time profile. An example of such pulse currents is illustrated in FIG. 3. This pulse current has a sine wave shaped profile. It is defined by a peak current $I_c$ and a time duration t. Pulse currents can produce thermal energy that may be large enough to open the fuse element but could possibly cause element fatigue and decrease the service life of the fuse element. The computing device 31 of the controller 30 can calculate the pulse energy E generated by this pulse current by using the formula $E=I_c^2 t$. The fuse's capability to withstand a pulse current without causing thermal stress to the fuse element can be determined once the pulse energy is calculated. FIG. 4 is a graph of the pulse cycle withstand capability of a blade fuse element. This graph indicates the number of pulses that can withstand the fuse element based on the calculated pulse energy E of the pulse. Similar graphs are available for other fuse types. Moreover, the pulse energy E may be calculated for other pulse waveform.

Similar calculation may also be carried for the voltage across the fuse element and/or the temperature of the fuse element. In particular, the controller 30 may determine current peaks and/or wave shapes of a current versus time profile, voltage peaks and/or wave shapes of a voltage versus time profile, and/or the temperatures of the fuse element when said current and/or voltage peaks occur, and/or the maximum and/or minimum temperatures of the fuse element during a determined period of time. Indeed, such features may have a direct impact on the service life of the fuse element. After the determination of said features, the controller 30 communicates them to the computing device 31 that is adapted to implement an algorithm to estimate a remaining service life of the fuse element. In particular, the controller 30 is adapted to determine specific areas of time over the period of time during which the voltage V1 or V2 and/or the temperature T1 or T2 is above or below a threshold value and the computing device 31 is adapted to calculate the duration of said specific areas of time.

The computing device 31 is adapted to correlate the calculated pulse energies E and/or the calculated duration into the algorithm to estimate a service life remaining of the fuse element.

Furthermore, the controller 30 is adapted to compare the estimated remaining service life of the fuse element with a theoretical limit value registered in the non-transitory memory 32 and to generate a warning alert when the estimated remaining service life of the fuse element is below said theoretical limit value.

As illustrated in FIG. 2, the controller 30 is adapted to communicate information regarding the estimated service life remaining of the fuse elements 14a, 14b to specific modules 34, 36, 38 of the battery system 100. In particular, a first module 34 is adapted to display the corresponding information to the user of the vehicle. A second module 36 is adapted to implement a diagnosis procedure. A third module 38 is adapted to transmit the information to remote systems via a telematic gateway.

It is to be understood that the present invention is not limited to the embodiments described above and illustrated in the drawings; rather, the skilled person will recognize that many changes and modifications may be made within the scope of the appended claims.

The invention claimed is:

1. A method for estimating the ageing state of fuse elements provided inside a vehicle fuse box, this method comprising steps that consist to:
   a) measure and monitor the current flowing through each fuse element;
   b) increment a counter each time the current flowing through the fuse element exceeds fuse rating, said counter corresponding to the number of current peaks supported by the fuse element;
   c) extract from a pre-established model a threshold number of current peaks that the fuse element can withstand;
   d) determining the ageing state of the fuse element as the quotient between the counter calculated at step b) and the threshold number extracted at step c), the fuse element being considered as worn out when said quotient reaches 100%.

2. The method of claim 1, wherein the method further comprises an additional step that consists to measure the temperature inside the fuse box and wherein pre-established model is selected as a function of the temperature inside the fuse box.

3. The method of claim 1, wherein the pre-established model to which it is referred to at step c) is pre-established based on experimental data.

4. The method of claim 1, wherein a plurality of counters can be incremented at step b), the selection of the counter to be incremented depends on the amplitude and duration of the peak.

5. The method of claim 4, wherein the method further comprises an additional step that consists to calculate, at each new current peak, the squared value of the current peak multiplied by time and to select the counter accordingly.

6. The method of claim 1, wherein the method further comprises additional steps that include:
Measuring and monitoring the voltage across each fuse element;
detecting an over-voltage event, corresponding to a situation in which the monitored voltage exceeds manufacturer recommendation;
recording amplitude and duration of the over-voltage event;
extracting from a preestablished model the maximum duration that the fuse element can withstand during over-voltage event;
determining the ageing state of the fuse element as the duration of over-voltage event and maximum duration extracted from preestablished model, the fuse element being considered as worn out when said quotient reaches 100%.

7. The method according to claim 1, wherein the ageing state of each fuse element is displayed on a dashboard screen of the vehicle, for example as a bargraph.

8. The method according to claim 1, wherein an alert is sent when one of the fuse elements is determined as worn out.

9. The method of claim 8, wherein the alert is displayed on a display screen inside the vehicle and/or sent to a remote server, for example to the attention of a fleet manager.

10. An electrical fuse maintenance system for a heavy-duty vehicle, comprising a Central Processing Unit (CPU) capable of computing the steps of the method of claim 1.

11. The electrical fuse maintenance system of claim 10, further comprising:
sensor means adapted to measure the current flowing through a fuse element, the voltage on the fuse element, the temperature of the fuse element, and/or the temperature of an environment surrounding the fuse element,
a controller configured to monitor said current, said voltage, said temperatures over a period of time while the fuse element is connected to an energized electrical power unit,
wherein, based on the monitored current, voltage and temperatures, the controller is adapted to estimate a service life remaining of the fuse element.

12. The system according to claim 11, wherein the controller is further configured to determine at least one feature among the following features: current peaks and/or wave shapes of a current versus time profile, voltage peaks and/or wave shapes of a voltage versus time profile, temperatures of the fuse element when said current and/or voltage peaks occur, the maximum and/or minimum temperatures of the fuse element over a period of time, and to communicate said at least one feature to a computing device that is adapted to implement an algorithm, said algorithm analysing said at least one feature to estimate a service life remaining of the fuse element.

13. The system according to claim 12, wherein the computing device is adapted to calculate a pulse energy E through the fuse element for each wave shape identified by the controller in the current versus time profile based on the formula $E=I_c^2*t$, where $I_c$ corresponds to the value of the current peak and t is the duration of the wave.

14. The system according to claim 12, wherein the controller is adapted to determine specific areas of time over the period of time during which the voltage and/or the temperature is above or below a threshold value and the computing device is adapted to calculate the duration of said specific areas of time.

15. The system according to claim 13, wherein the computing device is adapted to correlate the calculated pulse energies and/or the calculated duration into the algorithm to estimate a service life remaining of the fuse element.

16. The system according to claim 11, wherein the controller is configured to communicate information regarding the estimated service life remaining of the fuse element.

17. The system according to claim 11, wherein the controller is configured to compare the estimated service life remaining of the fuse element with a theoretical limit value registered in an internal data memory of the system and to display a warning alert when the estimated service life remaining of the fuse element is below said theoretical limit value.

18. An electrical system comprising at least one fuse element and the electrical fuse maintenance system according to claim 11.

19. A motorized vehicle comprising an electrical system according to claim 18, the motorized vehicle being preferably a truck.

* * * * *